United States Patent
Wang et al.

(10) Patent No.: US 7,897,454 B2
(45) Date of Patent: Mar. 1, 2011

(54) METAL-INSULATOR-METAL CAPACITOR AND FABRICATION METHOD THEREOF

(75) Inventors: Yuan Wang, Shanghai (CN); Buxin Zhang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 156 days.

(21) Appl. No.: 11/833,236

(22) Filed: Aug. 3, 2007

(65) Prior Publication Data
US 2008/0191311 A1 Aug. 14, 2008

(30) Foreign Application Priority Data
Feb. 13, 2007 (CN) .................... 2007 1 0037680

(51) Int. Cl.
*H01L 21/8242* (2006.01)
*H01L 21/00* (2006.01)

(52) U.S. Cl. ......... 438/253; 438/250; 438/254; 438/386; 438/422; 257/528; 257/532; 257/E21.009; 257/E21.011; 257/E21.582; 257/E27.048

(58) Field of Classification Search .................. 438/250, 438/253, 254, 386, 422; 257/528, 532, E21.009, 257/E21.011, E21.018, E21.582, E27.048
See application file for complete search history.

(56) References Cited

U.S. PATENT DOCUMENTS

| | | | | |
|---|---|---|---|---|
| 6,624,040 | B1* | 9/2003 | Ng et al. | 438/422 |
| 7,195,974 | B2* | 3/2007 | Hayashi | 438/250 |
| 2003/0113967 | A1* | 6/2003 | Allman et al. | 438/253 |
| 2005/0024979 | A1 | 2/2005 | Kim et al. | |
| 2007/0146963 | A1* | 6/2007 | Go | 361/272 |

FOREIGN PATENT DOCUMENTS

JP   2004-259827   9/2004

* cited by examiner

*Primary Examiner* — Dao H Nguyen
(74) *Attorney, Agent, or Firm* — Squire, Sanders & Dempsey (US) LLP

(57) ABSTRACT

The present invention provides a metal-insulator-metal capacitor, which comprises a semiconductor substrate; an interlayer dielectric layer disposed on the semiconductor substrate; and an insulation trench and two metal trenches all running through the interlayer dielectric layer and allowing the semiconductor substrate to be exposed; wherein the metal trenches being located on each side of the insulation trench and sharing a trench wall with the insulation trench respectively, the insulation trench being filled with insulation material as an insulation structure, the metal trenches being filled with metal material as electrodes of the capacitor.

6 Claims, 12 Drawing Sheets

METAL-INSULATOR-METAL CAPACITOR AND FABRICATION METHOD THEREOF

This application claims the priority of Chinese Patent Application No. 200710037680.4, filed Feb. 13, 2007, the entire disclosure of which is incorporated herein by reference.

FIELD OF THE INVENTION

The present invention relates to a semiconductor device and a fabrication method thereof, and more particularly to a metal-insulator-metal capacitor and a fabrication method thereof.

DESCRIPTION OF THE RELATED ART

In a very large scale integrated circuit, a capacitor is one type of commonly used passive elements. The capacitor is usually integrated into an active element such as a bipolar transistor or a Complementary Metal Oxide Semiconductor (CMOS) transistor. The current techniques for fabricating a capacitor can be classified into two groups, one employs polysilicon as electrodes and the other employs metal as electrodes. Polysilicon electrodes would bring about a problem of insufficient carriers, which leads to the capacitance changes with the surface voltage across both ends of the capacitor. Thus, the capacitor with polysilicon electrodes is deflected from the linearity requirement for the present logical circuit. In contrast, the capacitor with metal electrodes, generally termed as Metal-Insulator-Metal (MIM) capacitor, does not suffer from the problem above.

An existing method for fabricating a metal-insulator-metal capacitor is disclosed in Chinese patent No. 02105478.9. As shown in FIG. 1, a first dielectric layer 102 made of for example silicon oxide is formed on a semiconductor substrate 100 by chemical vapor deposition; the first dielectric layer 102 is planarized by Chemical Mechanical Polish (CMP) after depositing the first dielectric layer 102; a first barrier layer 103 made of for example titanium nitride and titanium is formed on the first dielectric layer 102 by sputtering to prevent the subsequently formed metal layer from diffusing into the first dielectric layer 102; a first metal layer 104 made of for example copper or aluminum copper alloy is formed on the first barrier layer 103 as a lower electrode of the capacitor by chemical vapor deposition; a second barrier layer 105 is formed on the first metal layer 104 by sputtering to prevent the first metal layer 104 from diffusing into other layers; an insulating layer 106 having a good dielectric constant is formed on the second barrier layer 105 by chemical vapor deposition for insulation between the metal layers; a third barrier layer 107 is formed on the insulating layer 106 by sputtering to prevent the subsequently formed metal layer from diffusing into the insulating layer; a second metal layer 108 made of for example copper or aluminum copper alloy is formed on the third barrier layer 107 as an upper electrode of the capacitor by chemical vapor deposition; an etching stop layer 110 made of for example silicon nitride is formed on the second metal layer 108 by chemical vapor deposition as a hard mask for subsequently etching metal layers; a first photoresist layer 111 is formed on the etching stop layer 110 by spin coating; a first pattern for defining the upper electrode of the capacitor is formed on the first photoresist layer 111 after exposure and development treatment.

As shown in FIG. 2, using the first photoresist layer 111 as a mask, the etching stop layer 110, the second metal layer 108, the third barrier layer 107 and the insulating layer 106 is removed partially by dry etching until the second barrier layer 105 is exposed; the remaining second metal layer 108 after etching is used as the upper electrode 108a of the capacitor; then the first photoresist layer 111 is removed.

As shown in FIG. 3, a second photoresist layer 112 is formed on the etching stop layer 110 and the first metal layer 104 by spin coating; a second pattern for defining an lower electrode of the capacitor is formed on the second photoresist layer 112 after exposure and development treatment; using the second photoresist layer 112 as a mask, the second barrier layer 105 and the first metal layer 104 are etched partially by dry etching until the first barrier layer 103 is exposed; the remaining first metal layer 104 after etching is used as the lower electrode 104a of the capacitor.

As shown in FIG. 4, the second photoresist layer 112 is removed after forming the upper electrode 108a and lower electrode 104a; a second dielectric layer 114 made of for example Borophosphosilicate Glass (BPSG) or silicon oxide is formed on the first barrier layer 103, the second barrier layer 105 and the etching stop layer 110 by chemical vapor deposition, in order to isolate the upper electrode 108a, the lower electrode 104a and the metal layer deposited subsequently from each other; the second dielectric layer 114 is planarized by chemical mechanical polishing; a third photoresist layer 115 is formed on the second dielectric layer 114 by spin coating; an opening pattern 116 which corresponds to a contact hole connecting with the upper electrode 108a and an opening pattern 117 which corresponds to a contact hole connecting with the lower electrode 104a are formed on the third photoresist layer 115 after exposure and development treatment.

As shown in FIG. 5, using the third photoresist layer 115 as a mask, the second dielectric layer 114 and the etching stop layer 110 are etched partially by dry etching along the opening pattern 116 until the upper electrode 108a is exposed, thus an opening 118 is formed; in the meantime, the second dielectric layer 114 and the second barrier layer 105 are etched partially along the opening pattern 117 until the lower electrode 104a is exposed, thus an opening 119 is formed.

As shown in FIG. 6, the openings 118 and 119 are filled with metal materials to form a contact hole 120 connecting with the upper electrode 108a and a contact hole 121 connecting with the lower electrode 104a, so that the upper electrode 108a and the lower electrode 104a are both connected with the subsequent wiring.

The known method for fabricating a MIM capacitor is limited by its high cost and the number of steps, since the formation of upper electrode and lower electrode should be carried out respectively and the exposure, development and etching treatment are repeated. Moreover, due to the fact that the formation of contact holes on the upper electrode and the lower electrode is carried out simultaneously, but there is a difference in the height between the upper electrode and the lower electrode, it has the risk of an excessive etching to the contact hole connecting with the upper electrode and an insufficient etching to the contact hole connecting with the lower electrode.

SUMMARY OF THE INVENTION

The object of the present invention is to provide a metal-insulator-metal capacitor and a method for fabricating the same, according to which the cost on manufacture of a MIM capacitor is reduced and an excessive etching or an insufficient etching is avoided.

In the first aspect according to the present invention, there is provided a metal-insulator-metal capacitor, which comprises a semiconductor substrate; an interlayer dielectric layer disposed on the semiconductor substrate; and a trench to be filled with an insulation material (hereinafter refers to "insulation trench") and two trenches to be filled with a metal (hereinafter refers to "metal trench") all running through the interlayer dielectric layer and allowing the semiconductor substrate to be exposed; wherein the metal trenches being located on each side of the insulation trench and sharing a trench wall with the insulation trench respectively, the insulation trench being filled with insulation material to form an insulation structure, the metal trenches being filled with metal material to form electrodes of the capacitor.

The critical dimension of the insulation structure is in a range of 60 nm~180 nm.

The insulation material comprises high-k material. Preferably, the high-k material is selected from the group consisting of tantalum oxide ($Ta_2O_5$), hafnium oxide ($HfO_2$), zirconia ($ZrO_2$), titanium oxide ($TiO_2$), hafnium silicate (HfSiO), alumina ($Al_2O_3$), barium strontium titanate (BST) and platinum zirconium titanate (PZT).

The critical dimension of the electrode is in a range of 100 nm~500 nm.

The metal material comprises copper or aluminum copper alloy.

In the second aspect according to the present invention, there is provided a method for fabricating a metal-insulator-metal capacitor, which comprises forming an interlayer dielectric layer on a semiconductor substrate; forming an insulation trench in the interlayer dielectric layer to run through the interlayer dielectric layer and allow the semiconductor substrate to be exposed; filling the insulation trench with insulation material to form an insulation structure; forming two metal trenches in the interlayer dielectric layer to run through the interlayer dielectric layer and allow the semiconductor substrate to be exposed, the metal trenches being located on each side of the insulation trench and sharing a trench wall with the insulation trench respectively; and filling the metal trenches with metal material to form electrodes of the capacitor.

The critical dimension of the insulation structure is in a range of 60 nm~180 nm.

The insulation material comprises a high-k material. Preferably, the high-k material is selected from the group consisting of tantalum oxide ($Ta_2O_5$), hafnium oxide ($HfO_2$), zirconia ($ZrO_2$), titanium oxide ($TiO_2$), hafnium silicate (HfSiO), alumina ($Al_2O_3$), barium strontium titanate (BST) and platinum zirconium titanate(PZT).

The critical dimension of the electrode is in a range of 100 nm~500 nm.

The metal material comprises copper or aluminum copper alloy.

In the third aspect according to the present invention, there is provided a method for fabricating a metal-insulator-metal capacitor, which comprises forming an interlayer dielectric layer on a semiconductor substrate; forming two metal trenches in the interlayer dielectric layer to run through the interlayer dielectric layer and allow the semiconductor substrate to be exposed; filling the metal trenches with metal material to form electrodes of the capacitor; forming an insulation trench in the interlayer dielectric layer to run through the interlayer dielectric layer and allow the semiconductor substrate to be exposed, the insulation trench being located between the two metal trenches and sharing a trench wall with the metal trenches; and filling the insulation trench with insulation material to form an insulation structure.

According to the present invention, two metal trenches are formed and thus two electrodes are formed simultaneously. The fabrication of the capacitor is simplified due to the fact that exposure, developing and etching treatment are reduced. Therefore, the cost is reduced and the present method has less steps than the prior art. Furthermore, an excessive etching to the contact hole connecting with the upper electrode and an insufficient etching to the contact hole connecting with the lower electrode is avoided.

DETAILED DESCRIPTION OF THE INVENTION

The known method for fabricating a MIM capacitor is limited by its high cost and the number of steps, since the formation of upper electrode and lower electrode should be carried out respectively and the exposure, development and etching treatment are repeated. Moreover, due to the fact that the formation of contact holes on the upper electrode and the lower electrode is carried out simultaneously, but there is a difference in the height between the upper electrode and the lower electrode, it has the risk of an excessive etching to the contact hole connecting with the upper electrode and an insufficient etching to the contact hole connecting with the lower electrode. According to the present invention, two metal trenches are formed and thus two electrodes are formed simultaneously. The fabrication of the capacitor is simplified due to the fact that exposure, developing and etching treatment are reduced. Therefore, the cost is reduced and the present method has less steps than the prior art. Furthermore, an excessive etching to the contact hole connecting with the upper electrode and an insufficient etching to the contact hole connecting with the lower electrode is avoided. The above objects, features and advantages of the present invention will become better understood with respect to the following description of the preferred embodiments given in conjunction with the accompanying drawings.

Figure 1:
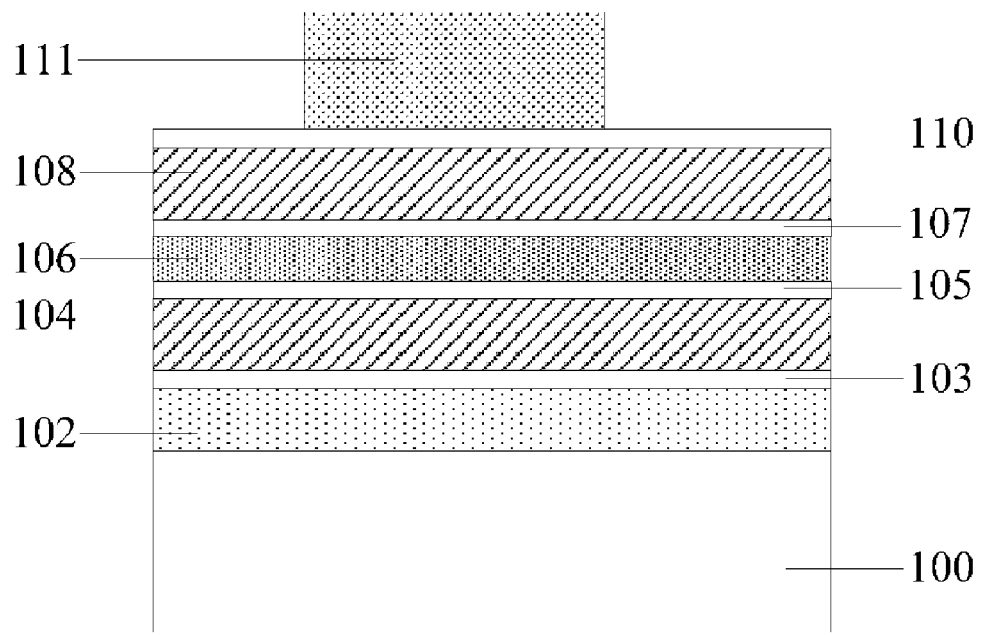
FIGS. 1 to 6 are views illustrating an existing method for forming a metal-insulator-metal capacitor.
Figure 2:
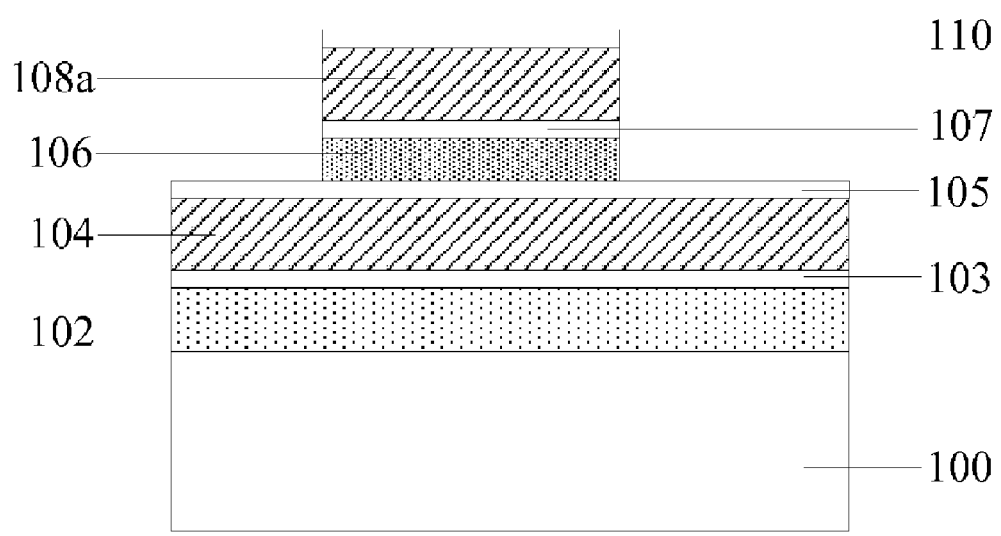
Figure 3:
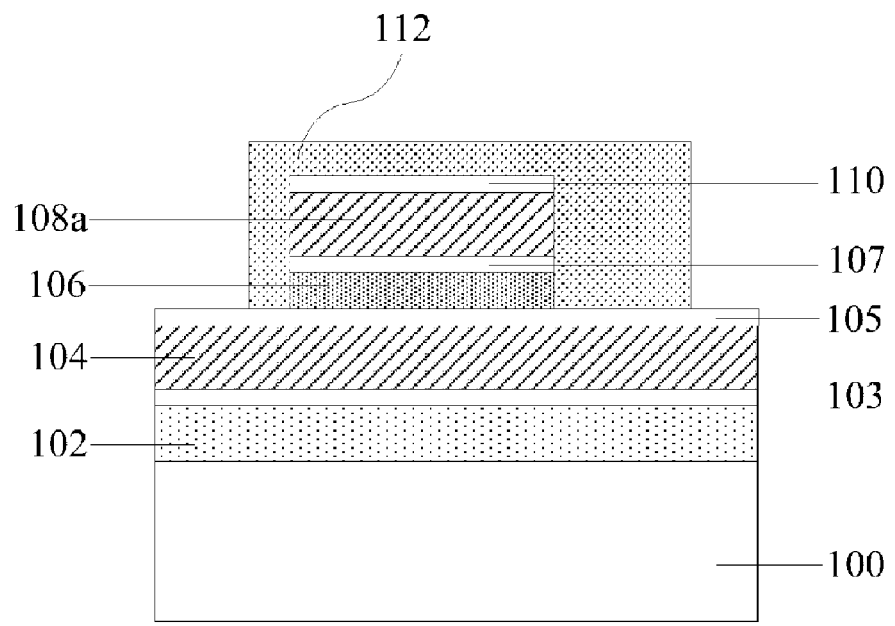
Figure 4:
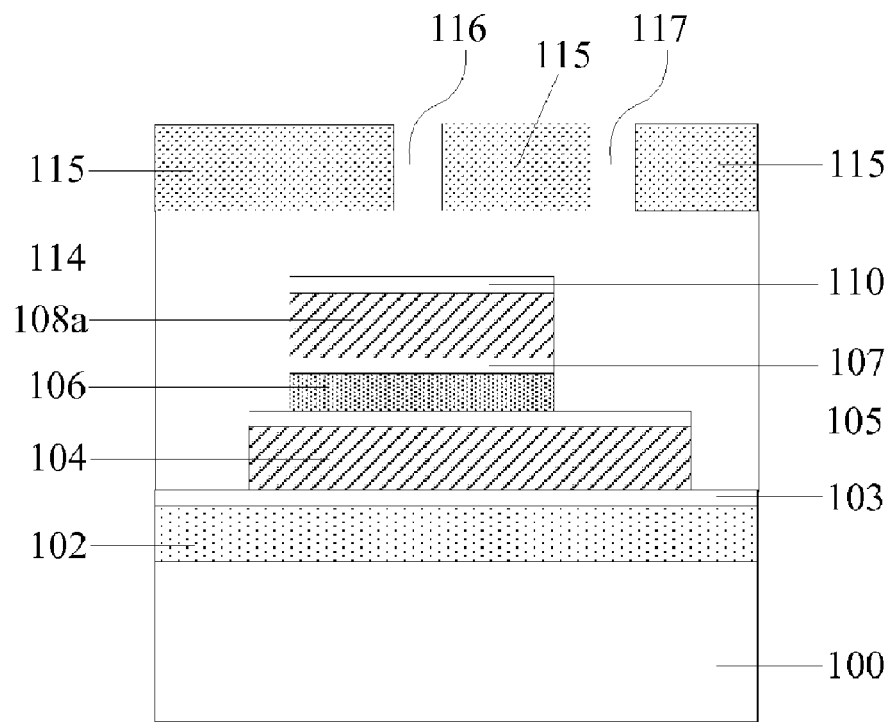
Figure 5:
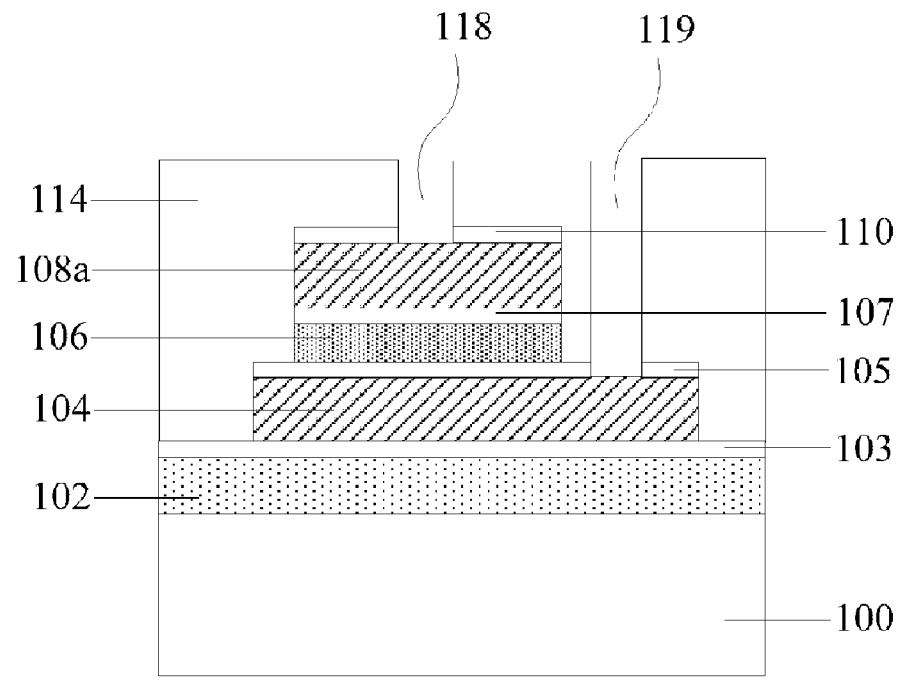
Figure 6:
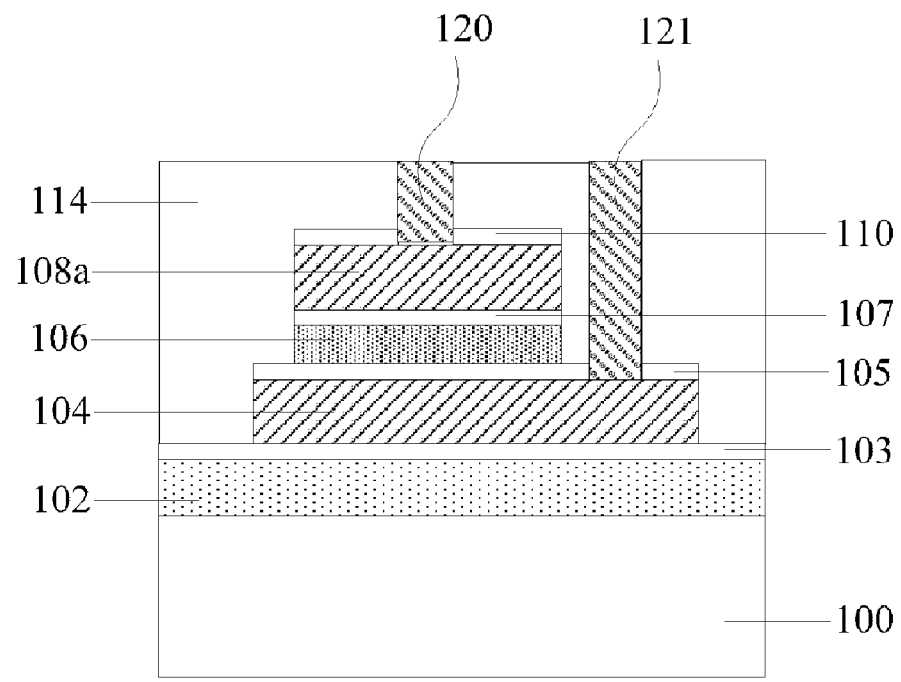
Figure 7:
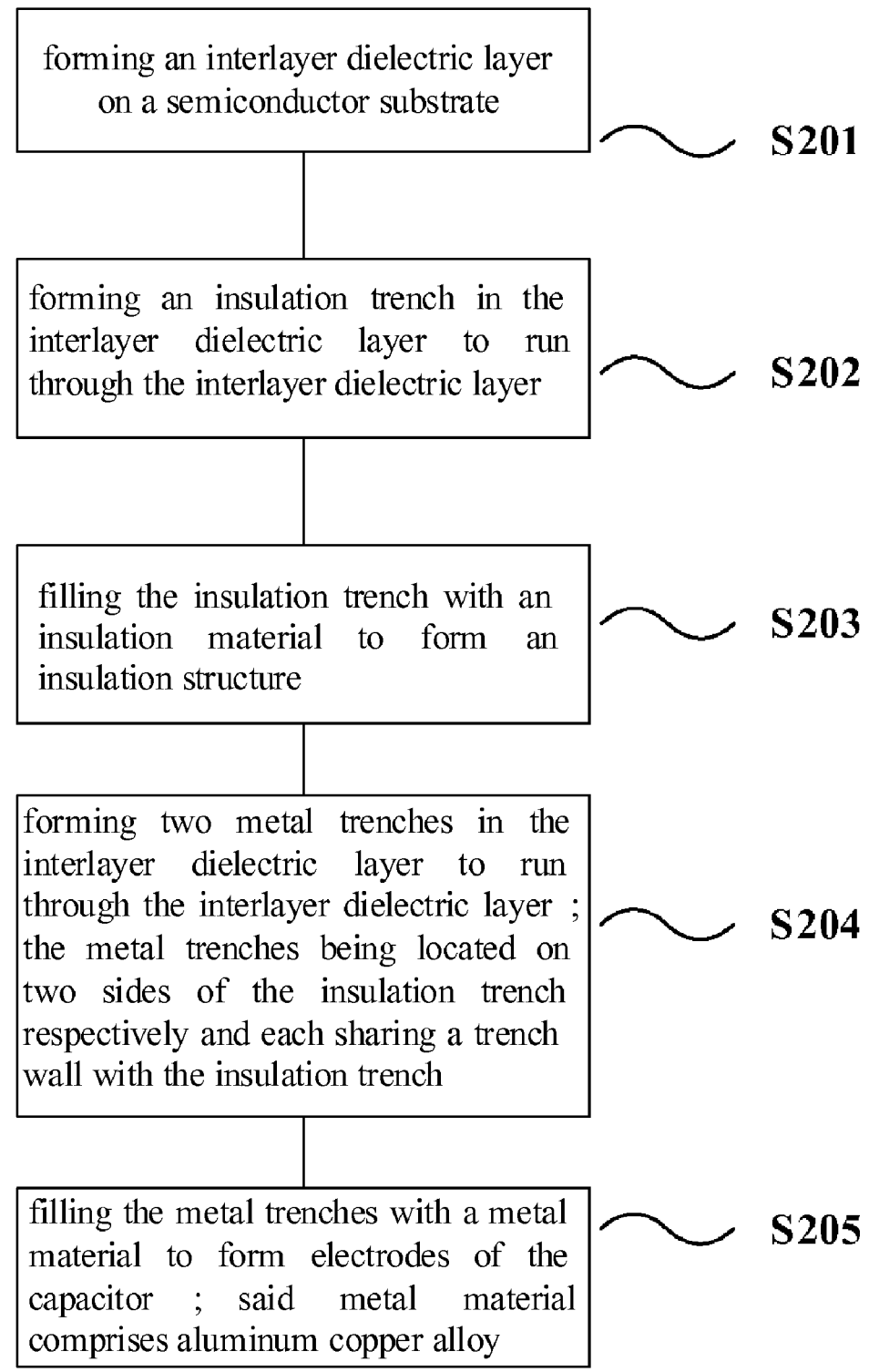
FIG. 7 is a flow diagram illustrating a method for fabricating metal-insulator-metal capacitor according to a first embodiment of the present invention.

FIG. 7 is a flow diagram illustrating a method for fabricating metal-insulator-metal capacitor according to a first embodiment of the present invention. As shown in FIG. 7, an interlayer dielectric layer is formed on a semiconductor substrate by carrying out the step S201.

In this embodiment, the interlayer dielectric layer is made of silicon oxide or Borophosphosilicate Glass (BPSG) and the manner of forming the interlayer dielectric layer is the well-known chemical vapor deposition.

An insulation trench is formed in the interlayer dielectric layer to run through the interlayer dielectric layer and allow semiconductor substrate to be exposed by carrying out the step S202.

In this embodiment, the insulation trench is formed by dry etching the interlayer dielectric layer until the semiconductor substrate is exposed.

The insulation trench is filled with insulation material to form an insulation structure by carrying out the step S203.

In this embodiment, the insulation material is a high-k material. The material may be selected from the group consisting of tantalum oxide ($Ta_2O_5$), hafnium oxide ($HfO_2$), zirconia ($ZrO_2$), titanium oxide ($TiO_2$), hafnium silicate (HfSiO), alumina ($Al_2O_3$), barium strontium titanate (BST) and platinum zirconium titanate (PZT). The critical dimension of the insulation structure is in a range of 60 nm~180 nm.

Two metal trenches are formed in the interlayer dielectric layer to run through the interlayer dielectric layer and allow the semiconductor substrate to be exposed by carrying out the step S204. These two metal trenches are located on each side of the insulation trench and share a trench wall with the insulation trench respectively.

In this embodiment, the metal trenches are formed by dry etching the interlayer dielectric layer until the semiconductor substrate is exposed.

The metal trenches are filled with metal material to form the electrodes of the capacitor by carrying out the step S205.

In this embodiment, the metal material is copper or aluminum copper alloy. The critical dimension of the electrode is in a range of 100 nm~500 nm.

Figure 8:
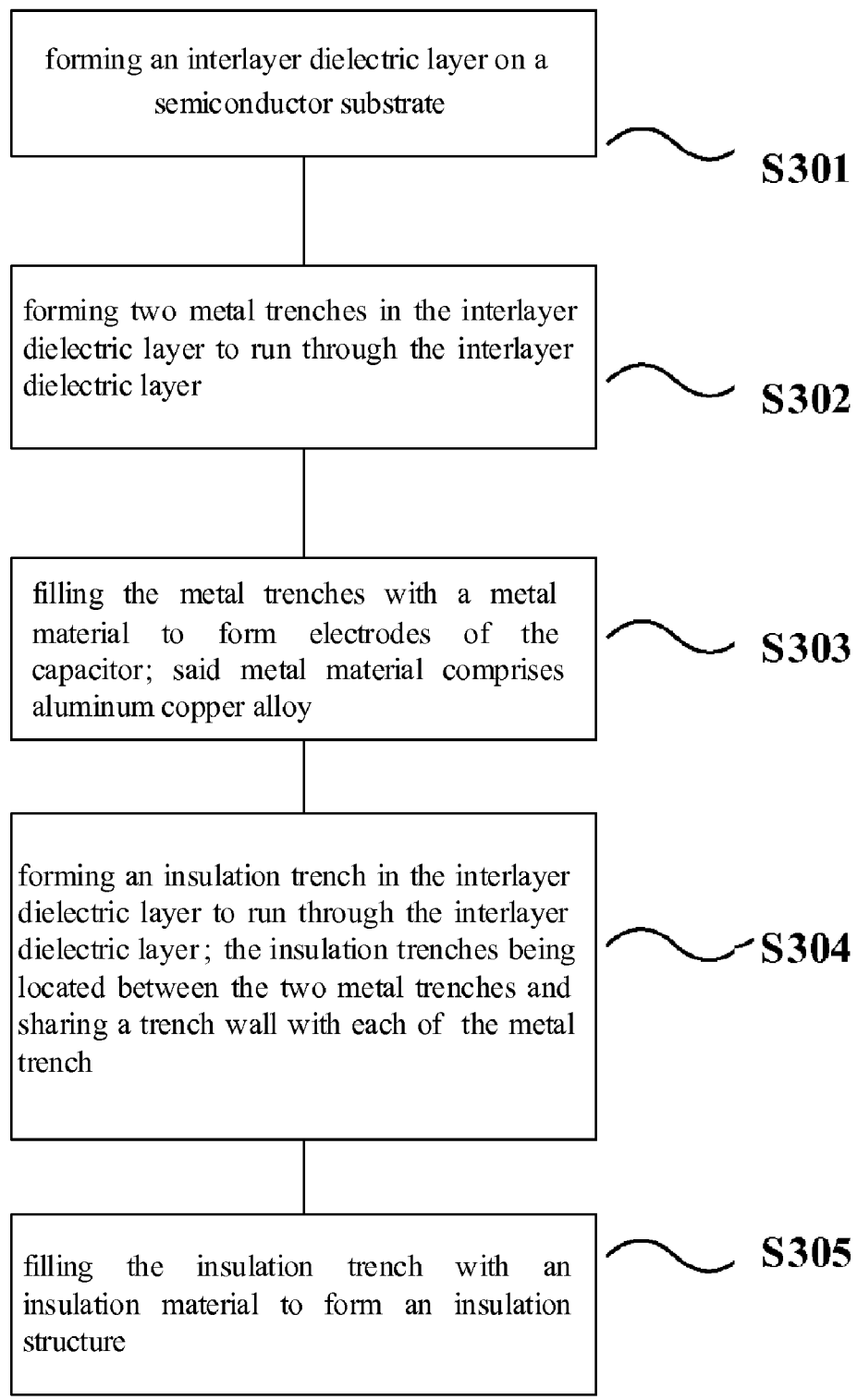
FIG. 8 is a flow diagram illustrating a method for fabricating metal-insulator-metal capacitor according to a second embodiment of the present invention.

FIG. 8 is a flow diagram illustrating a method for fabricating metal-insulator-metal capacitor according to a second embodiment of the present invention. As shown in FIG. 8, an interlayer dielectric layer is formed on a semiconductor substrate by carrying out the step S301.

In this embodiment, the interlayer dielectric layer is made of silicon oxide or Borophosphosilicate Glass (BPSG) and the manner of forming the interlayer dielectric layer is the well-known chemical vapor deposition.

Two metal trenches are formed in the interlayer dielectric layer to run through the interlayer dielectric layer and allow the semiconductor substrate to be exposed by carrying out the step S302.

In this embodiment, the metal trenches are formed by dry etching the interlayer dielectric layer until the semiconductor substrate is exposed.

The metal trenches are filled with metal material to form the electrodes of the capacitor by carrying out the step S303.

In this embodiment, the metal material is copper or aluminum copper alloy. The critical dimension of the electrode is in a range of 100 nm~500 nm.

An insulation trench is formed in the interlayer dielectric layer to run through the interlayer dielectric layer and allow semiconductor substrate to be exposed by carrying out the step S304. The insulation trench is located between the two metal trenches and shares a trench wall with the metal trenches.

In this embodiment, the insulation trench is formed by dry etching the interlayer dielectric layer until the semiconductor substrate is exposed.

The insulation trench is filled with insulation material to form an insulation structure by carrying out the step S305.

In this embodiment, the insulation material is a high-k material. The material may be selected from the group consisting of tantalum oxide ($Ta_2O_5$), hafnium oxide ($HfO_2$), zirconia ($ZrO_2$), titanium oxide ($TiO_2$), hafnium silicate (HfSiO), alumina ($Al_2O_3$), barium strontium titanate (BST) and platinum zirconium titanate(PZT). The critical dimension of the insulation structure is in a range of 60 nm~180 nm.

Figure 9:
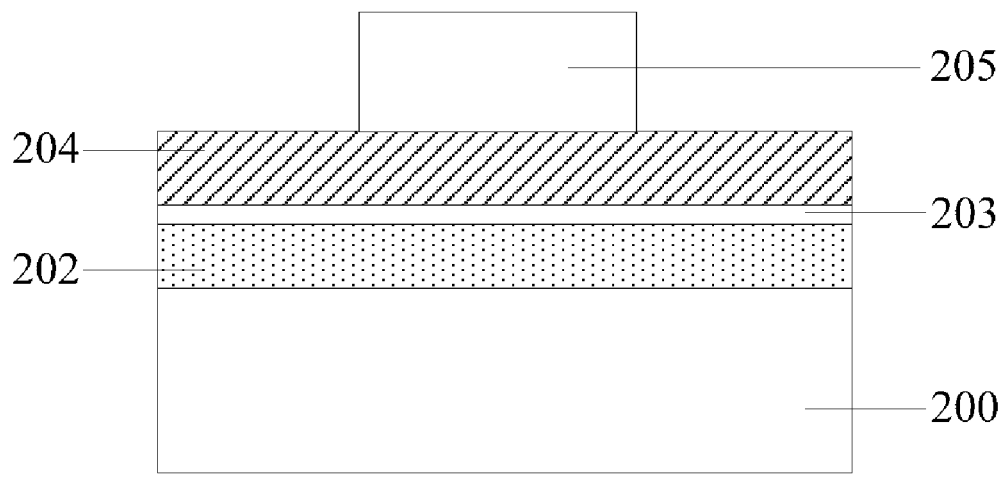
FIGS. 9 to 16 are views illustrating a method for fabricating metal-insulator-metal capacitor according to the first embodiment of the present invention.

FIGS. 9 to 16 are views illustrating a method for fabricating metal-insulator-metal capacitor according to the first embodiment of the present invention. As shown in FIG. 9, a first dielectric layer 202 made of silicon oxide or Borophosphosilicate Glass (BPSG) is formed on a semiconductor substrate 200 by chemical vapor deposition or physical vapor deposition. After the deposition, the first dielectric layer 202 is planarized by Chemical Mechanical Polish (CMP) to reduce the thicknesses of the first dielectric layer 202 to be 1000 angstroms~10000 angstroms. A first barrier layer 203 consisting of titanium nitride and titanium and having a thicknesses of 100 angstroms~400 angstroms is formed on the first dielectric layer 202 by sputtering to prevent the subsequently formed metal layer from diffusing into the first dielectric layer 202. A first metal layer 204 made of copper or aluminum copper alloy is formed on the first barrier layer 203 as a connecting metal wiring for the electrodes of capacitor by chemical vapor deposition. The first metal layer 204 has a thickness of 4000 angstroms~6000 angstroms. A first photoresist layer 205 is formed on the first metal layer 204 by spin coating. And the first photoresist layer 205 is patterned by the well-known exposure and developing treatment.

In this embodiment, the first dielectric layer 202 has a thickness of 1000 angstroms, 2000 angstroms, 3000 angstroms, 4000 angstroms, 5000 angstroms, 6000 angstroms, 7000 angstroms, 8000 angstroms, 9000 angstroms or 10000 angstrom or more after the planarization. The first barrier layer 203 has a thickness of 100 angstroms, 200 angstroms, 300 angstroms or 400 angstrom or more and the first metal layer 204 has a thickness of 4000 angstroms, 5000 angstroms or 6000 angstrom or more.

Figure 10:
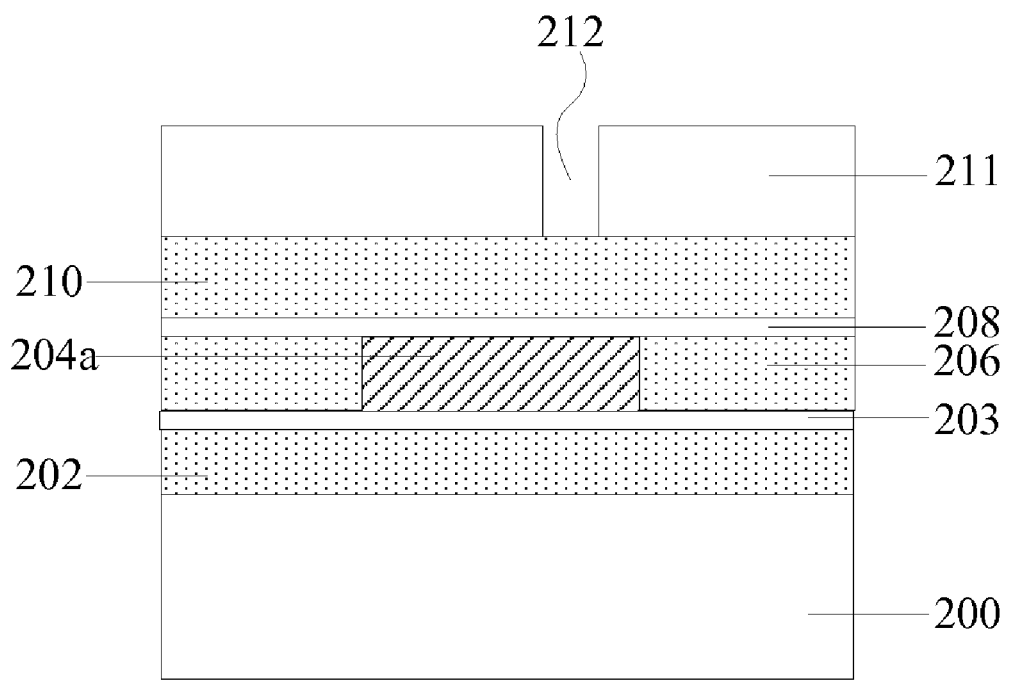

As shown in FIG. 10, using the first photoresist layer 205 as a mask, the first metal layer 204 is etched by dry etching to form a metal wiring 204a. The gas used in the etching is a mixture of $Cl_2$ and $BCl_3$ with a volume ratio of $Cl_2$ to $BCl_3$ of 2:1. The first photoresist layer 205 is removed by ashing treatment at a temperature of 200° C.~300° C. A second dielectric layer 206 made of silicon oxide or Borophosphosilicate Glass is formed on the metal wiring 204a and the first barrier layer 203. The second dielectric layer 206 is planarized by Chemical Mechanical Polish (CMP) until the metal wiring 204a is exposed. A second barrier layer 208 is formed on the metal wiring 204a and the second dielectric layer 206 by sputtering to prevent the metal wiring 204a from diffusing into the dielectric layer formed subsequently. The second barrier layer 208 consists of titanium nitride and titanium, and has a thickness of 100 angstroms~400 angstroms. A third dielectric layer 210 made of silicon oxide or Borophosphosilicate Glass, with a thickness of 3000 angstroms~15000 angstroms, is formed on the second barrier layer 208 by chemical vapor deposition. A second photoresist layer 221 is formed on the planarized third dielectric layer 210, and then is patterned to form a contact hole pattern 212 by the well-known exposure and developing treatment.

In this embodiment, the temperature for ashing the first photoresist layer 205 is 200° C., 220° C., 240° C., 260° C., 280° C. or 300° C. respectively, and preferably is 250° C.

The second dielectric layer 206 has a thickness of 4000 angstroms~6000 angstroms after the planarization, for example 4000 angstroms, 5000 angstroms, or 6000 angstrom or more. The second barrier layer 208 has a thickness of 100 angstroms, 200 angstroms, 300 angstroms, 400 angstrom or more. The third dielectric layer 210 has a thickness of 3000 angstroms, 4000 angstroms, 5000 angstroms, 6000 angstroms, 7000 angstroms, 8000 angstroms, 9000 angstroms, 10000 angstroms, 11000 angstroms, 12000 angstroms, 13000 angstroms, 14000 angstroms or 15000 angstrom after the planarization.

Figure 11:
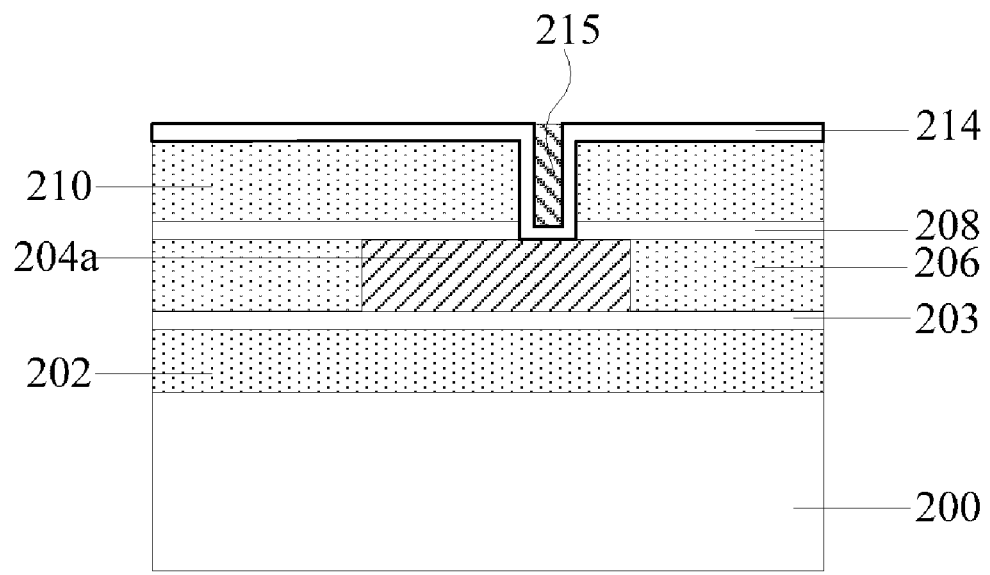

As shown in FIG. 11, using the second photoresist layer 211 as a mask, the third dielectric layer 210 and the second barrier layer 208 are etched by dry etching along the contact hole pattern 212 until the metal wiring 204a is exposed;

thereby a contact hole 213 is formed. The gas used in the etching is a mixture of $CF_4$ and $O_2$ with a ratio of $CF_4$ to $O_2$ of 5:1. The second photoresist layer 211 is removed by ashing treatment at a temperature of 200° C.~300° C. A third barrier layer 214 is formed on the third dielectric layer 210 and inside the contact hole 213 by sputtering to prevent the metal of a subsequent formed metal plug from diffusing into the third dielectric layer 210. The third barrier layer 214 consists of titanium nitride and titanium, and has a thickness of 100 angstroms~400 angstroms. The contact hole 213 is filled with copper by chemical vapor deposition to form a copper plug 215. In addition to copper, aluminum copper alloy or tungsten can also be used.

In this embodiment, the formation of the copper plug 215 comprises forming a copper layer on the third barrier layer 214 and filling the contact hole 213 with copper, then planarizing the copper layer by Chemical Mechanical Polishing until the third barrier layer 214 is exposed.

In this embodiment, the temperature for ashing the second photoresist layer 211 is particularly 200° C., 220° C., 240° C., 260° C., 280° C. or 300° C., and is preferably 250° C.

The third barrier layer 214 has a thickness of 100 angstroms, 200 angstroms, 300 angstroms or 400 angstrom or more.

Figure 12:
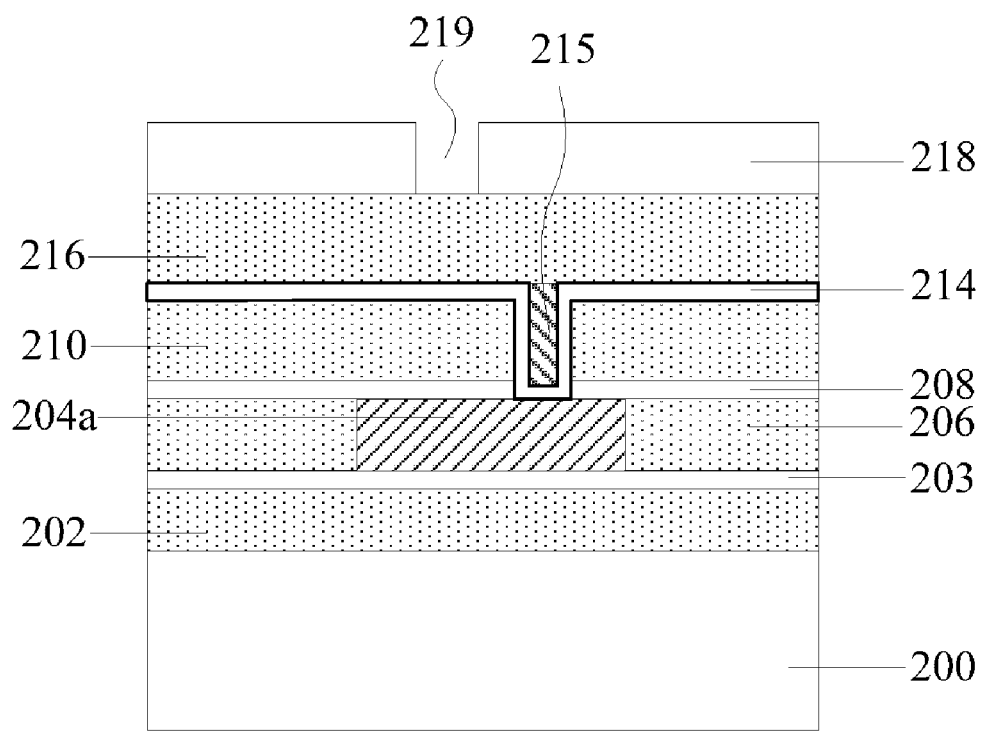

As shown in FIG. 12, an interlayer dielectric layer 216 made of silicon oxide or Borophosphosilicate Glass is formed on the third barrier layer 214 and the copper plug 215 by chemical vapor deposition. Then, the interlayer dielectric layer 216 is planarized by CMP to reduce the thickness of the interlayer dielectric layer 216 to be 5000 angstroms~30000 angstroms. A third photoresist layer 218 is formed on the interlayer dielectric layer 216 by spin coating. An insulation trench pattern 219 which corresponds to an insulation trench is formed on the third photoresist layer 218 by exposure and developing treatment.

In this embodiment, the thickness of the interlayer dielectric layer 216 is particularly 5000 angstroms, 6000 angstroms, 7000 angstroms, 8000 angstroms, 9000 angstroms, 10000 angstroms, 15000 angstroms, 20000 angstroms, 25000 angstroms, 30000 angstrom or more after the planarization.

Figure 13:
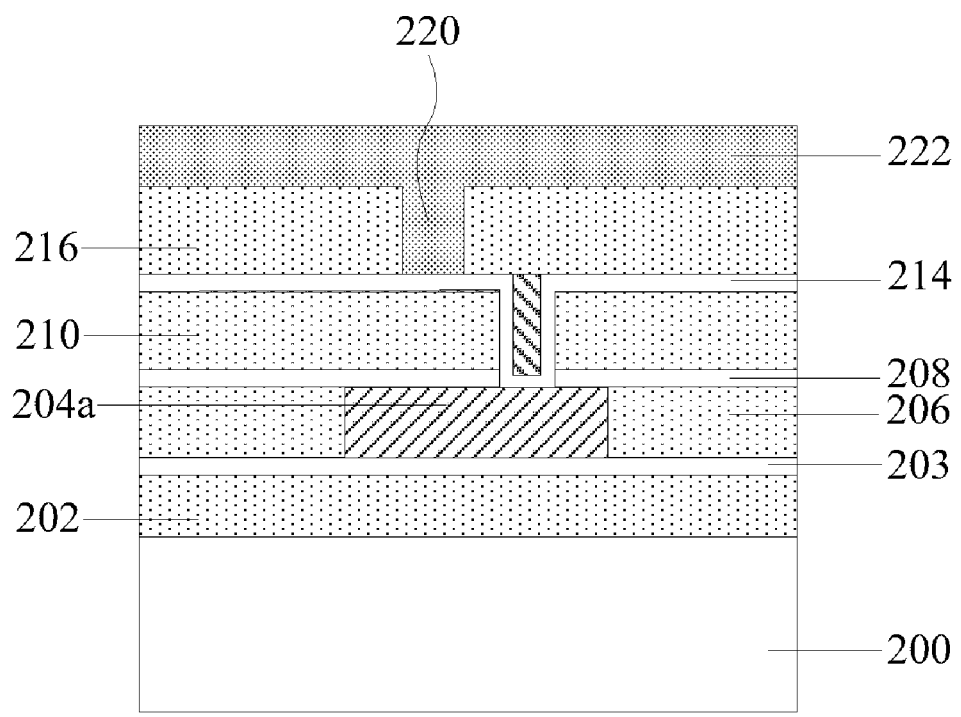

As shown in FIG. 13, using the third photoresist layer 218 as a mask, the interlayer dielectric layer 216 is etched along the insulation trench pattern 219 by dry etching until the third barrier layer 214 is exposed; thereby an insulation trench 220 is formed. The gas used in the etching is a mixture of $CF_4$ and $O_2$ with a ratio of $CF_4$ to $O_2$ of 5:1. The third photoresist layer 218 is removed by ashing treatment at a temperature of 200° C.~300° C. An insulation layer 222 is formed on the interlayer dielectric layer 216 by chemical vapor deposition and the insulation trench 220 is filled with the insulation layer 222 for the insulation between the metals. The material of the insulation layer 222 should be a high-k material, such tantalum oxide ($Ta_2O_5$), hafnium oxide ($HfO_2$), zirconia ($ZrO_2$), titanium oxide ($TiO_2$), hafnium silicate (HfSiO), alumina ($Al_2O_3$), barium strontium titanate (BST) and platinum zirconium titanate(PZT).

In this embodiment, the temperature for ashing the third photoresist layer 218 is particularly 200° C., 220° C., 240° C., 260° C., 280° C. or 300° C., and is preferably 250° C.

Figure 14:
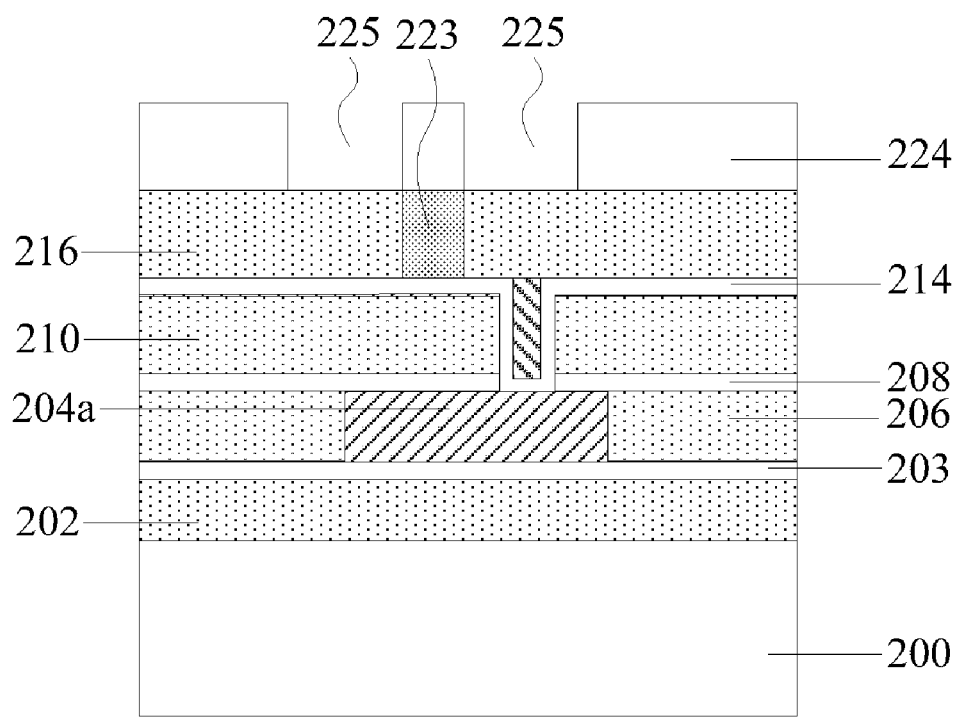

As shown in FIG. 14, the insulation layer 222 is planarized by CMP until the interlayer dielectric layer 216 is exposed; thereby an insulation structure 223 is formed. A fourth photoresist layer 224 is formed on the interlayer dielectric layer 216 and the insulation structure 223 by spin coating. Then metal trench patterns 225 which correspond to metal trenches are formed on the fourth photoresist layer 224 by exposure and developing treatment.

The critical dimension of the insulation structure 223 is in a range of 60 nm~180 nm, for example 60 nm, 80 nm, 100 nm, 120 nm, 140 nm, 160 nm or 180 nm.

Figure 15:
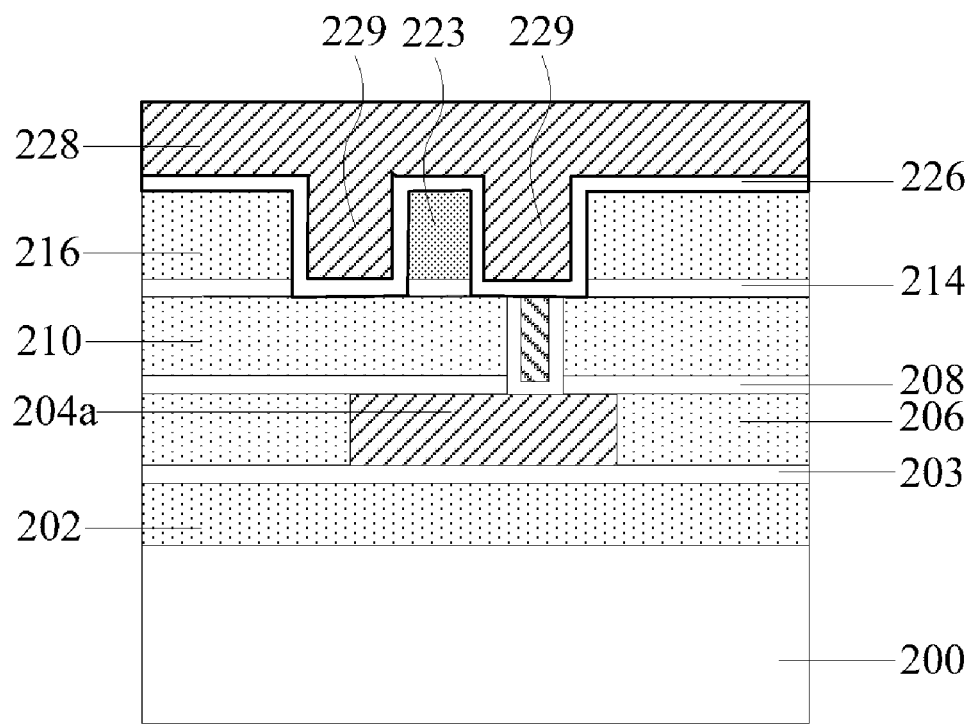

As shown in FIG. 15, the interlayer dielectric layer 216 and the third barrier layer 214 are etched along the metal trench patterns 225 by dry etching until the third dielectric layer 210 is exposed, thereby forming metal trenches 229 which share a trench wall with the insulation trench 220. The fourth photoresist layer 224 is removed by ashing treatment at a temperature of 200° C.~300° C. A fourth barrier layer 226 is formed on the interlayer dielectric layer 216 and the side walls and bottom of the metal trenches 229 by sputtering to prevent the diffusion between the electrodes and the insulation trench 220. The fourth barrier layer 226 consists of titanium nitride and titanium, and has a thickness of 400 angstroms~600 angstroms. A metal layer 228 is formed on the fourth barrier layer 226 by chemical vapor deposition, and the metal trenches 229 are filled with the metal layer 228.

In this embodiment, the thickness of the fourth barrier layer 226 is particularly 400 angstroms, 450 angstroms, 500 angstroms, 550 angstroms or 600 angstrom.

Figure 16:
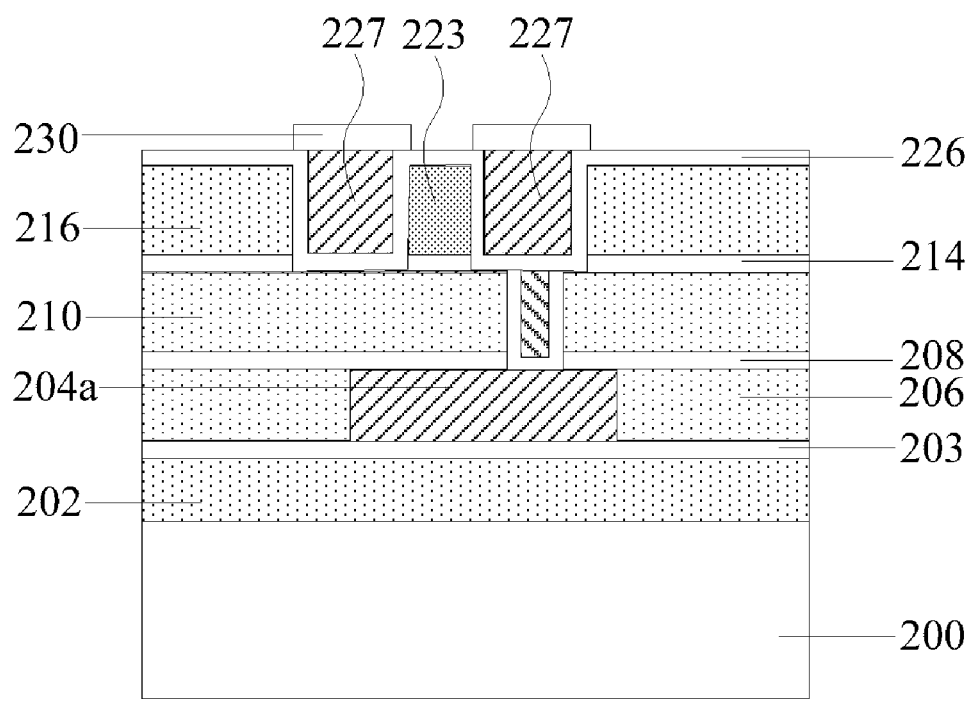

As shown in FIG. 16, the metal layer 228 is planarized by CMP until the fourth barrier layer 226 is exposed, thereby forming capacitor electrodes 227. A metal-insulator-metal (MIM) capacitor is constituted by the electrodes 227 together with the insulation structure 223. One electrode 227 is connected with the metal wiring 204a via the copper plug 215. Then bonding pads 230 are prepared on the electrodes 227 for a subsequent packaging.

In this embodiment, the critical dimension of the electrodes 227 is in a range of 100 nm~500 nm, such as 100 nm, 200 nm, 300 nm, 400 nm or 500 nm.

In this embodiment, since the two electrodes of the capacitor are formed simultaneously, the invention does not need repeated exposure, developing and etching treatment. Thus the cost is reduced and the method is simplified. And it will not cause an excessive etching or an insufficient etching.

According to the present invention, the metal-insulator-metal capacitor comprises a semiconductor substrate; an interlayer dielectric layer disposed on the semiconductor substrate; and an insulation trench and two metal trenches all running through the interlayer dielectric layer and allowing the semiconductor substrate to be exposed; wherein the metal trenches being located on each side of the insulation trench and contacting with the insulation trench, the insulation trench being filled with insulation material and the metal trenches being filled with metal material.

Figure 17:
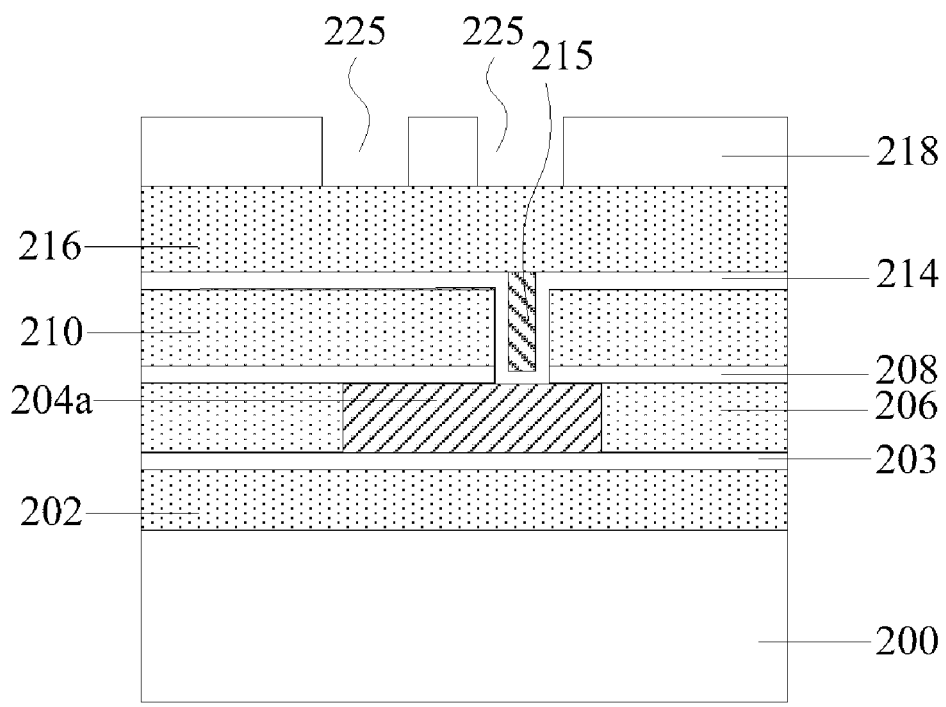
FIGS. 17 to 21 are views illustrating a method for fabricating metal-insulator-metal capacitor according to the second embodiment of the present invention.

FIGS. 17 to 21 are views illustrating a method for fabricating metal-insulator-metal capacitor according to the second embodiment of the present invention. The steps of forming each dielectric layer and metal wiring layer are in consistent with that illustrated in FIGS. 9 to 11 in according with the first embodiment. As shown in FIG. 17, an interlayer dielectric layer 216 made of silicon oxide or Borophosphosilicate Glass is formed on the third barrier layer 214 and the copper plug 215 by chemical vapor deposition. Then, the interlayer dielectric layer 216 is planarized by CMP to reduce the thickness of the interlayer dielectric layer 216 to be 5000 angstroms~30000 angstroms. A third photoresist layer 218 is formed on the interlayer dielectric layer 216 by spin coating. Metal trench patterns 225 which correspond to metal trenches are formed on the third photoresist layer 218 by exposure and developing treatment.

In this embodiment, the thickness of the interlayer dielectric layer 216 is particularly 5000 angstroms, 6000 angstroms, 7000 angstroms, 8000 angstroms, 9000 angstroms, 10000 angstroms, 15000 angstroms, 20000 angstroms, 25000 angstroms or 30000 angstrom after the planarization.

Figure 18:
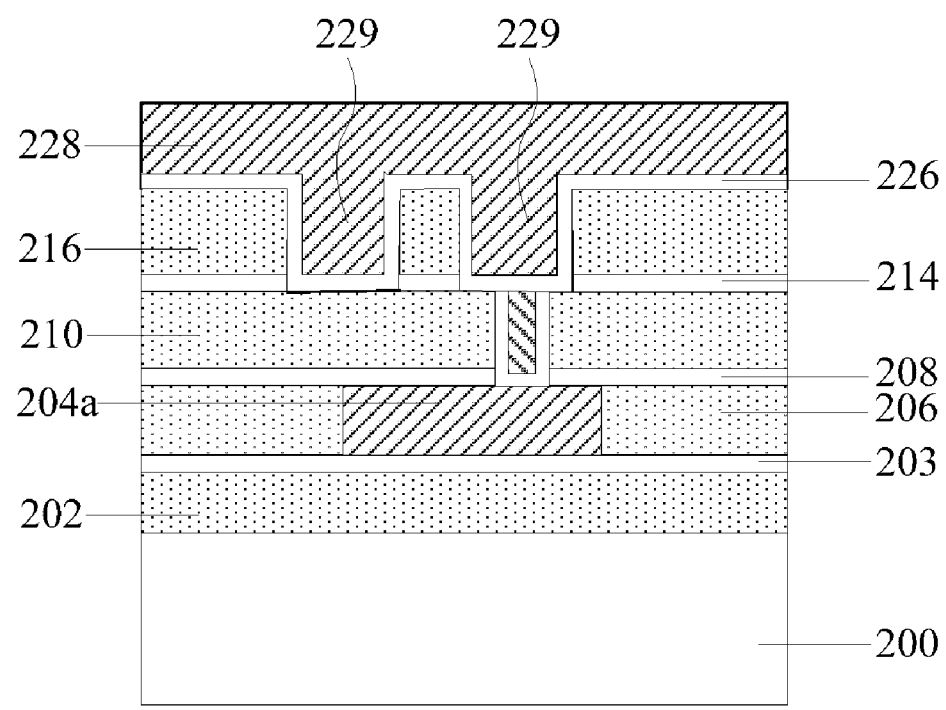

As shown in FIG. 18, using the third photoresist layer 218 as a mask, the interlayer dielectric layer 216 and the third barrier layer 214 are etched along the metal trench patterns 225 by dry etching until the third dielectric layer 210 is exposed, thereby forming metal trenches 229. The gas used in the etching is a mixture of $CF_4$ and $O_2$ with a ratio of $CF_4$ to $O_2$ of 5:1. The third photoresist layer 218 is removed by ashing treatment at a temperature of 200° C.~300° C. A fourth barrier layer 226 is formed on the interlayer dielectric layer 216 and the side walls and bottoms of metal trenches 229 by sputtering to prevent the diffusion between electrodes and the insulation trench 220. The fourth barrier layer 226 consists of titanium nitride and titanium, and has a thickness of 400 angstroms~600 angstroms. A metal layer 228 is formed on the fourth barrier layer 226 by chemical vapor deposition, and the metal trenches 229 are filled with the metal layer 228.

In this embodiment, the temperature for ashing the third photoresist layer 218 is particularly 200° C., 220° C., 240° C., 260° C., 280° C. or 300° C., and is preferably 250° C.

In this embodiment, the thickness of the fourth barrier layer 226 is particularly 400 angstroms, 450 angstroms, 500 angstroms, 550 angstroms or 600 angstroms.

Figure 19:
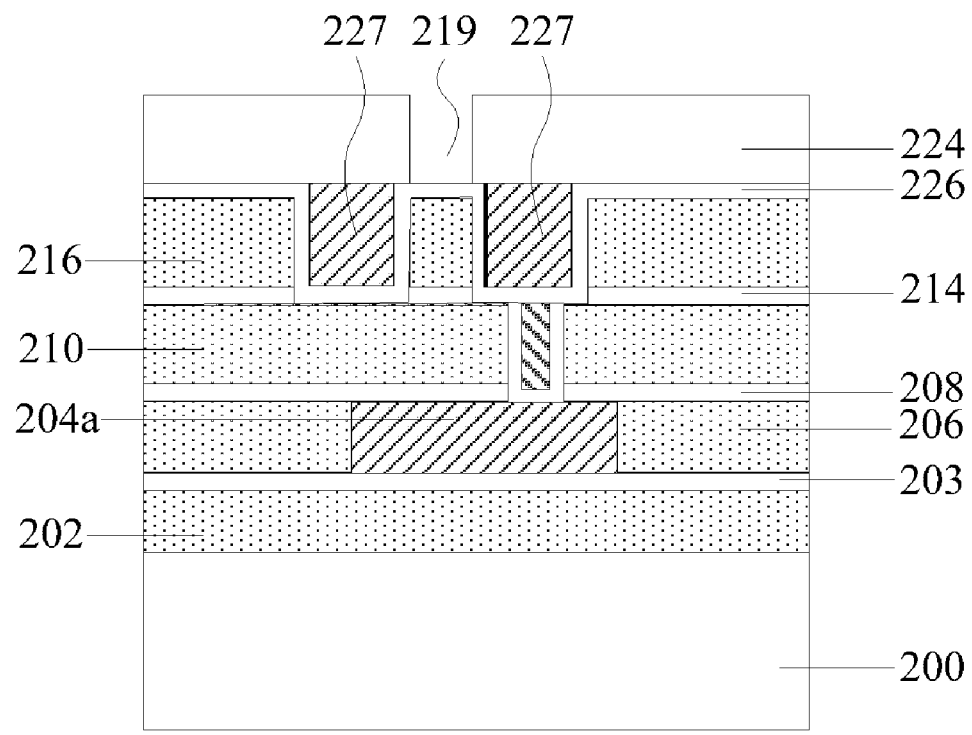

As shown in FIG. 19, the metal layer 228 is planarized by CMP until the fourth barrier layer 226 is exposed, thereby forming capacitor electrodes 227. A fourth photoresist layer 224 is formed on the fourth barrier layer 226 and the metal electrodes 227 by spin coating. An insulation trench pattern 219 which corresponds to an insulation trench is formed on the fourth photoresist layer 224 by exposure and developing treatment.

In this embodiment, the critical dimension of the electrodes 227 is in a range of 100 nm~500 nm, and is particularly 100 nm, 200 nm, 300 nm, 400 nm or 500 nm.

Figure 20:
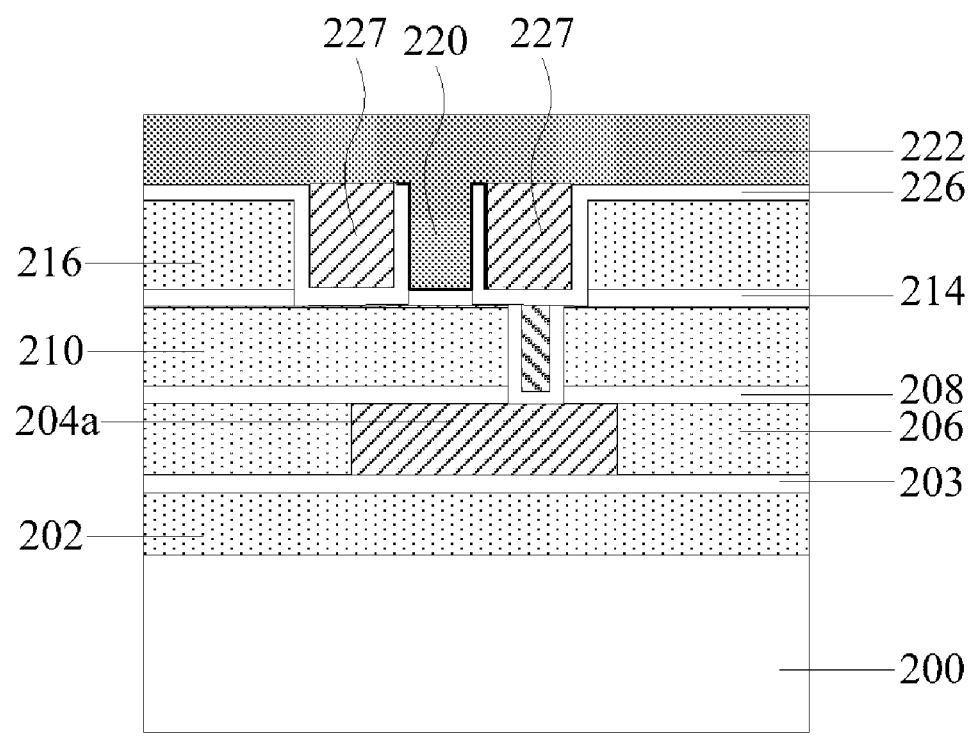

As shown in FIG. 20, using the fourth photoresist layer 224 as a mask, the fourth barrier layer 226 and the interlayer dielectric layer 216 are etched along the insulation trench pattern 219 by dry etching until the third barrier layer 214 is exposed, thereby forming a insulation trench 220 which is disposed between the two electrodes 227 and contacted with them. The gas used in the etching is a mixture of $CF_4$ and $O_2$ with a ratio of $CF_4$ to $O_2$ of 5:1. The fourth photoresist layer 224 is removed by ashing treatment at a temperature of 200° C.~300° C. An insulation layer 222 is formed on the fourth barrier layer 226 by chemical vapor deposition and the insulation trench 220 is filled with the insulation layer 222 for the insulation between the metal electrodes 227. The material of the insulation layer 222 should be a high-k material, such as tantalum oxide ($Ta_2O_5$), hafnium oxide ($HfO_2$), zirconia ($ZrO_2$), titanium oxide ($TiO_2$), hafnium silicate (HfSiO), alumina ($Al_2O_3$), barium strontium titanate (BST) and platinum zirconium titanate(PZT).

Figure 21:
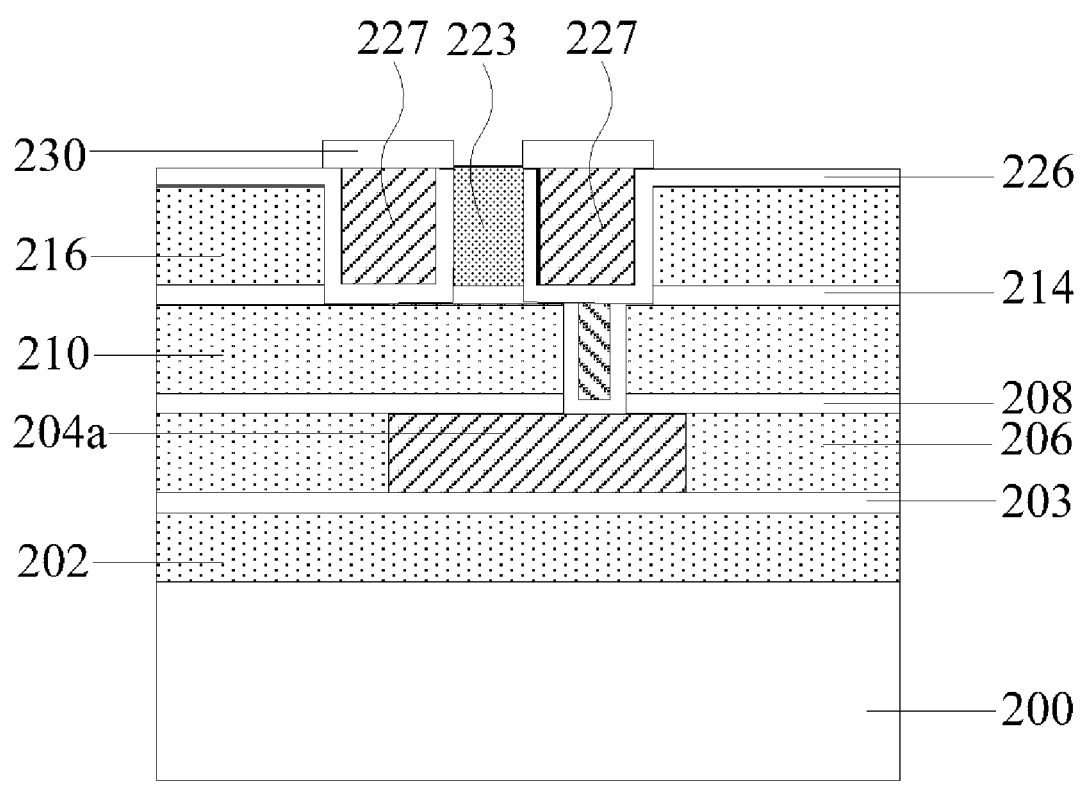

As shown in FIG. 21, the insulation layer 220 is planarized by CMP until the fourth barrier layer 226 is exposed, thereby forming an insulation structure 223. A metal-insulator-metal (MIM) capacitor is constituted by the capacitor electrodes 227 together with the insulation structure 223. One electrode 227 is connected with the metal wiring 204a via the copper plug 215. Then bonding pads 230 are prepared on the electrodes 227 for a subsequent packaging.

In this embodiment, the critical dimension of the insulation structure 223 is in a range of 60 nm~180 nm, for example 60 nm, 80 nm, 100 nm, 120 nm, 140 nm, 160 nm or 180 nm.

With reference to FIG. 16 or 21, the metal-insulator-metal capacitor according to the present invention comprises a semiconductor substrate 200; a first dielectric layer 202 formed on the semiconductor substrate 200; a first barrier layer 203 disposed on the first dielectric layer 202 to prevent a metal layer formed subsequently from diffusing into the first dielectric layer 202; a metal wiring 204a formed on the first barrier layer 203; a dielectric layer disposed on the metal wiring layer and a metal contact hole running through the dielectric layer; a second dielectric layer 206 disposed around the metal wiring 204a and having a thickness equal to that of the metal wiring 204a; a second barrier layer 208 formed on the metal wiring 204a and the second dielectric layer 206 to prevent the metal wiring 204a from diffusing into the dielectric layer; a third dielectric layer 210 formed on the second barrier layer 208; a copper plug 215 running through the third dielectric layer 210 and the second barrier layer 208; a third barrier layer 214 disposed on the third dielectric layer 210 for isolating the copper plug 215 from the third dielectric layer 210 and connecting the copper plug 215 with the metal wiring 204a; an interlayer dielectric layer 216 disposed on the third barrier layer 214 and the copper plug 215; an insulation structure 223 running through the interlayer dielectric layer 216 and contacting the third barrier layer 214; electrodes 227 running through the interlayer dielectric layer 216 and located on each side of the insulation structure 223, one of the electrodes 227 connecting with the copper plug 215; a fourth barrier layer 226 formed on the interlayer dielectric layer 216 and inside of the electrodes 227 for preventing the diffusion between electrodes and the insulation structure 223.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a metal-insulator-metal capacitor, comprising the following steps:
   forming a second dielectric layer and a metal wiring therein on a semiconductor substrate;
   forming a third dielectric layer and a plug therein on the second dielectric layer, the plug being connected with the metal wiring;
   forming an interlayer dielectric layer on the third dielectric layer above the semiconductor substrate;
   forming an insulation trench in the interlayer dielectric layer to run through the interlayer dielectric layer;
   filling the insulation trench with an insulation material to form an insulation structure;
   forming two metal trenches in the interlayer dielectric layer to run through the interlayer dielectric layer; the metal trenches being located on two sides of the insulation trench respectively and each sharing a trench wall with the insulation trench; and
   simultaneously filling the metal trenches with a metal material to form electrodes of the capacitor, one of the electrodes being connected with the metal wiring via the plug; said metal material comprises aluminum copper alloy.

2. The method for fabricating a metal-insulator-metal capacitor as claimed in claim 1, wherein the critical dimension of the insulation structures is in a range of 60 nm-80 nm.

3. The method for fabricating a metal-insulator-metal capacitor as claimed in claim 1, wherein the insulation material comprises a high-k material.

4. The method for fabricating a metal-insulator-metal capacitor as claimed in claim 3, wherein the high-k material is selected from the group consisting of tantalum oxide ($Ta_2O_5$), hafnium oxide ($HfO_2$), zirconia ($ZrO_2$), titanium oxide (TiO$_2$), hafnium silicate (HfSiO$_2$), alumina (Al$_2$O$_3$), barium strontium titanate (BST) and platinum zirconium titanate (PZT).

5. The method for fabricating a metal-insulator-metal capacitor as claimed in claim 1, wherein the critical dimension of the electrode is in a range of 100 nm -500 nm.

6. A method for fabricating a metal-insulator-metal capacitor, comprising the following steps:

forming a second dielectric layer and a metal wiring therein on a semiconductor substrate;

forming a third dielectric layer and a plug therein on the second dielectric layer, the plug connecting with the metal wiring;

forming an interlayer dielectric layer on the third dielectric layer above the semiconductor substrate;

forming two metal trenches in the interlayer dielectric layer to run through the interlayer dielectric layer;

simultaneously filling the metal trenches with a metal material to form electrodes of the capacitor, one of the electrodes being connected with the metal wiring via the plug; said metal material comprises aluminum copper alloy;

forming an insulation trench in the interlayer dielectric layer to run through the interlayer dielectric layer; the insulation trenches being located between the two metal trenches and sharing a trench wall with each of the metal trenches; and filling the insulation trench with an insulation material to form an insulation structure.

* * * * *